US007764102B2

(12) United States Patent
Pacha et al.

(10) Patent No.: US 7,764,102 B2
(45) Date of Patent: Jul. 27, 2010

(54) PULSE-GENERATOR CIRCUIT AND CIRCUIT ARRANGEMENT

(75) Inventors: Christian Pacha, Munich (DE); Klaus Von Arnim, Herzhorn (DE)

(73) Assignee: Infineon Technologies AG, Neubiberg (DE)

( * ) Notice: Subject to any disclaimer, the term of this patent is extended or adjusted under 35 U.S.C. 154(b) by 355 days.

(21) Appl. No.: 10/598,811

(22) PCT Filed: Feb. 16, 2005

(86) PCT No.: PCT/DE2005/000263

§ 371 (c)(1),
(2), (4) Date: Jun. 25, 2007

(87) PCT Pub. No.: WO2005/088837

PCT Pub. Date: Sep. 22, 2005

(65) Prior Publication Data
US 2007/0279115 A1    Dec. 6, 2007

(30) Foreign Application Priority Data
Mar. 12, 2004   (DE) .................. 10 2004 012 223

(51) Int. Cl.
*H03K 3/356* (2006.01)
(52) U.S. Cl. ................... 327/208; 327/210; 327/218
(58) Field of Classification Search ......... 327/202–203, 327/208, 210–212, 214, 217, 218
See application file for complete search history.

(56) References Cited

U.S. PATENT DOCUMENTS 4,910,713 A    3/1990   Madden et al.
5,821,791 A *  10/1998  Gaibotti et al. ............. 327/202
6,107,853 A    8/2000   Nikolic et al.
6,111,444 A    8/2000   Mikan, Jr. et al.
6,232,810 B1   5/2001   Oklobdzija et al.
6,448,829 B1   9/2002   Saraf
6,486,719 B2 * 11/2002  Kim ........................... 327/199
6,633,188 B1   10/2003  Jia et al.
2002/0024368 A1 2/2002  Kim

FOREIGN PATENT DOCUMENTS

JP    2000-299623    10/2000

OTHER PUBLICATIONS

Markovic, D. et al.; "Analysis and Design of Low-Energy Flip-Flops"; Proceedings of the International Symposium on Low Power Electronics and Design (ISLPED) 2001, Huntington Beach, CA, USA, pp. 52-55.

(Continued)

*Primary Examiner*—Long Nguyen
(74) *Attorney, Agent, or Firm*—Dickstein, Shapiro, LLP.

(57) ABSTRACT

Pulse-generator circuit for generating an input signal for a flip-flop circuit from a clock-pulse signal and a data signal. The circuit includes a control unit for controlling a clock-pulse field effect transistor, a logic field effect transistor and a feedback field effect transistor. To generate the input signal, the control unit is configured in such a way that the clock-pulse field effect transistor is controlled chronologically after the logic field effect transistor and the feedback field effect transistor, thus generating the flip-flop signal.

21 Claims, 5 Drawing Sheets

OTHER PUBLICATIONS

Dao, H.Q, et al.; "Analysis of Clocked Timing Elements for Dynamic Voltage Scaling Effects over Process Parameter Variation"; Proceedings of the International Symposium on Low Power Electronics and Design (ISLPED) 2001, Huntington Beach, CA, USA, pp. 56-59.

Montanaro, J., et al.; "A 160-MHz, 32-b, 0.5-W CMOS RISC Microprocessor"; IEEE Journal of Solid-State Circuits, vol. 31, No. 11, Nov. 1996, pp. 1703-1714.

* cited by examiner

PULSE-GENERATOR CIRCUIT AND CIRCUIT ARRANGEMENT

CROSS-REFERENCE TO RELATED APPLICATION

This application is a nation stage of International Patent Application Serial No. PCT/DE2005/000263, filed Feb. 16, 2005, which published in German on Sep. 22, 2005 as WO 2005/088837, and is incorporated herein by reference in its entirety.

FIELD OF THE INVENTION

The invention relates to a pulse generator circuit and to a circuit arrangement.

BACKGROUND OF THE INVENTION

Edge-controlled flip flops or edge-controlled master/slave latch pairs are essential basic building blocks for synchronizing multi-stage logic circuits. They are used in almost all modern integrated digital circuits such as digital signal processors (DSPs), microprocessors and integrated circuits for communication applications for increasing the data flow by means of pipelining. For applications with low active power dissipation, flip flops and master/slave latch pairs must still operate reliably and have sufficient switching speed when the difference between a supply voltage $V_{DD}$ and a threshold voltage of the transistors $V_T$ is low, that is to say when the gate overdrive voltage $V_{DD}-V_T$ is low.

In an implementation with modern sub-100 nm or CMOS technologies, it is apparent, however, that the parasitic capacitances of the MOS transistors form a part of the total capacitance to be driven which is not negligible. It is especially the junction and gate overlap capacitances between drain terminal and an internal or external output node which slow down the switching process. Particular attention must be paid to the fact that the gate-drain capacitances appear to be twice as large due to the Miller effect since both the gate potentials and the drain potentials change oppositely on a timescale of approximately 10 ps to 30 ps in the dynamic range.

In contrast to other circuit arrangements such as edge-controlled master/slave latch pairs, edge-controlled flip flops based on sense amplifiers have a high switching speed even with a low gate overdrive $V_{DD}-V_T$, see Marcovic, D., Nikolic, B., Brodersen, R. W. "Analysis and Design of Low-Energy Flip-Flops", Proc. of the International Symposium on Low Power Electronics and Design (ISLPED) 2001, Huntington Beach, USA, pp. 52-55.

With regard to robustness, flip flops based on sense amplifiers are less sensitive to process variations at low supply voltages than master/slave latch pairs as is disclosed in Dao, H. Q., Nowka, K., Oklobzija, V. G. "Analysis of Clocked Timing Elements for Dynamic Voltage Scaling Effects over Process Parameter Variation", Proc. of the International Symposium on Low Power Electronics and Design (ISLPED) 2001, Huntington Beach, USA, pp. 56-59.

After the introduction of such flip flops (see U.S. Pat. No. 6,232,810), improvements were made. Thus, for example, it was possible to achieve a more symmetric switching behavior, that is to say identical clock signal/flip flop signal delay times (CLK-Q delay times, with clock signal CLK, flip flop signal Q, inverted flip flop signal/Q) for a flip flop with the differential outputs Q and /Q.

In the further text, a circuit arrangement 100 as disclosed in U.S. Pat. No. 6,232,810 is described with reference to FIG. 1.

The circuit arrangement 100 is formed from a pulse generator part-circuit 101, a flip flop part-circuit 102 and a switching part-circuit 103.

In the pulse generator part-circuit 101, a clock signal CLK is provided at a clock signal input 104. The clock signal input 104 is coupled to the gate terminal of an n-MOS clock pulse field effect transistor 105. A first source/drain terminal of the n-MOS clock pulse field effect transistor 105 is connected to the electrical ground potential $V_{SS}$ 115. A second source/drain terminal of the n-MOS clock pulse field effect transistor 105 is coupled to a first source/drain terminal of a first n-MOS logic field effect transistor 106, at the gate terminal of which a data signal D is applied. The second source/drain terminal of the n-MOS clock pulse field effect transistor 105 is also coupled to a first source/drain terminal of a second n-MOS logic field effect transistor 107, at the gate terminal of which a data signal /D is applied which is complementary to the data signal D. A second source/drain terminal of the first n-MOS logic field effect transistor 106 is coupled to a first source/drain terminal of an n-MOS bypass field effect transistor 108, the gate terminal of which is connected to an electrical potential $V_{DD}$. A second source/drain terminal of the n-MOS bypass field effect transistor 108 is coupled to a second source/drain terminal of the second n-MOS logic field effect transistor 107. Furthermore, a second source/drain terminal of the first n-MOS logic field effect transistor 106 is coupled to a first source/drain terminal of a first n-MOS signal transfer field effect transistor 109. A second source/drain terminal of the first n-MOS signal transfer field effect transistor 109 is coupled to a first source/drain terminal of a first p-MOS clock pulse field effect transistor 111 and to a first source/drain terminal of a first p-MOS feedback field effect transistor 112. A second source/drain terminal of the first p-MOS clock pulse field effect transistor 111 and a second source/drain terminal of the first p-MOS feedback field effect transistor 112 are connected to the electrical potential of the supply voltage $V_{DD}$ 116. Furthermore, the gate terminal of the first n-MOS signal transfer field effect transistor 109 is coupled to the gate terminal of the first p-MOS feedback field effect transistor 112. The second source/drain terminal of the second n-MOS logic field effect transistor 107 is coupled to a first source/drain terminal of a second n-MOS signal transfer field effect transistor 110, the second source/drain terminal of which is coupled to a first source/drain terminal of a second p-MOS clock pulse field effect transistor 113 and to a first source/drain terminal of a second p-MOS feedback field effect transistor 114. The gate terminal of the second n-MOS signal transfer field effect transistor 110 is coupled to the gate terminal of the second p-MOS feedback field effect transistor 114. Furthermore, a second source/drain terminal of the second p-MOS clock pulse field effect transistor 113 and a second source/drain terminal of the second p-MOS feedback field effect transistor 114 are connected to the electrical potential of the supply voltage $V_{DD}$ 116. The gate terminal of the first p-MOS clock pulse field effect transistor 111 is coupled to the clock signal input 104. Furthermore, the clock signal input 104 is coupled to the gate terminal of the second p-MOS clock pulse field effect transistor 113.

In the further text, the interconnection within the flip flop part-circuit 102 is described.

A first source/drain terminal of a first p-MOS flip flop field effect transistor 125 is connected to the supply potential $V_{DD}$ 116. Furthermore, a second source/drain terminal of the first p-MOS flip flop field effect transistor 125 is coupled to a first source/drain terminal of a first n-MOS flip flop field effect transistor 126, the second source/drain terminal of which is connected to the electrical ground potential 115. A first source/drain terminal of a second p-MOS flip flop field effect transistor 127 is connected to the electrical ground potential 115. A second source/drain terminal of the second p-MOS flip flop field effect transistor 127 is coupled to a first source/drain terminal of a second n-MOS flip flop field effect transistor 128, the second source/drain terminal of which is connected to the electrical ground potential 115. The gate terminal of the first p-MOS flip flop field effect transistor 125 and the gate terminal of the first n-MOS flip flop field effect transistor 126 are coupled to one another and form a storage node /Q of the flip flop part-circuit 102. Furthermore, the gate terminal of the second p-MOS flip flop field effect transistor 127 and the gate terminal of the second n-MOS flip flop field effect transistor 128 are coupled to one another and form a storage node Q of the flip flop part-circuit 102. The second source/drain terminal of the first p-MOS flip flop field effect transistor 125 is coupled to the gate terminal of the second p-MOS flip flop field effect transistor 127. Furthermore, a second source/drain terminal of the second p-MOS flip flop field effect transistor 127 is coupled to the gate terminal of the first n-MOS flip flop field effect transistor 126.

In the further text, the interconnection within the switching part-circuit 103 is described.

A first source/drain terminal of a first p-MOS switching field effect transistor 117 is connected to the supply potential 116. A second source/drain terminal of the first p-MOS switching field effect transistor 117 is coupled to a first source/drain terminal of a first n-MOS switching field effect transistor 118, the second source/drain terminal of which is connected to the electrical ground potential 115. Furthermore, a first source/drain terminal of a second p-MOS switching field effect transistor 119 is connected to the electrical supply potential 116. A second source/drain terminal of the second p-MOS switching field effect transistor 119 is coupled to a first source/drain terminal of a second n-MOS switching field effect transistor 120, the second source/drain terminal of which is connected to the electrical ground potential 115.

A first source/drain terminal of a third p-MOS switching field effect transistor 121 is connected to the electrical supply potential 116. A second source/drain terminal of the third p-MOS switching field effect transistor 121 is coupled to a first source/drain terminal of a third n-MOS switching field effect transistor 122, the second source/drain terminal of which is connected to the electrical ground potential 115. The gate terminal of the third p-MOS switching field effect transistor 121, the gate terminal of the third p-MOS switching field effect transistor 122 and the gate terminal of the second p-MOS switching field effect transistor 119 are coupled to one another. Furthermore, a first source/drain terminal of a fourth p-MOS switching field effect transistor 123 is connected to the supply potential 116. A second source/drain terminal of the fourth p-MOS switching field effect transistor 123 is coupled to a first source/drain terminal of a fourth n-MOS switching field effect transistor 124, the second source/drain terminal of which is connected to the electrical ground potential 115. The gate terminal of the fourth p-MOS switching field effect transistor 123, the gate terminal of the fourth n-MOS switching field effect transistor 124 and the gate terminal of the first p-MOS switching field effect transistor 117 are coupled to one another.

In the further text, the interconnection of the part-circuits 101, 102, 103 with one another is described.

The gate terminal of the second p-MOS feedback field effect transistor 114 is coupled to the gate terminal of the first p-MOS switching field effect transistor 117. Furthermore, the gate terminal of the first p-MOS feedback field effect transistor 112 is coupled to the gate terminal of the second p-MOS switching field effect transistor 119. The second source/drain terminal of the third p-MOS switching field effect transistor 121 is coupled to the gate terminal of the first n-MOS switching field effect transistor 118. The second source/drain terminal of the fourth p-MOS switching field effect transistor 123 is coupled to the gate terminal of the second n-MOS switching field effect transistor 120. The second source/drain terminal of the first p-MOS switching field effect transistor 117 is coupled to the gate terminal of the second p-MOS flip flop field effect transistor 127. Furthermore, the second source/drain terminal of the second p-MOS switching field effect transistor 119 is coupled to the second source/drain terminal of the second p-MOS flip flop field effect transistor 127.

At the gate terminal of the second p-MOS feedback field effect transistor 114, an input signal /S generated by the pulse generator part-circuit 101 is provided for the flip flop part-circuit 102. Furthermore, an input signal /R of the flip flop part-circuit 102, generated by the pulse generator part-circuit 101, is provided at the gate terminal of the first p-MOS feedback field effect transistor 112.

In the further text, the operation of the circuit arrangement 100, which represents an edge-controlled flip flop based on sense amplifiers, is described.

With regard to the basic circuit building blocks, the edge-controlled flip flop in FIG. 1 is a circuit arrangement 100 which has the pulse generator circuit 101 formed from the transistors 105 to 114. Depending on the signals at the data inputs D and /D on the rising edge of the clock signal CLK, the internal inputs S, /S, R, /R of a set/reset flip flop (formed from the transistors of the flip flop part-circuit 102 and the switching part-circuit 103) are set. The output signals /S and /R of the pulse generator part-circuit 101 are precharged to the electrical supply potential $V_{DD}$ 116 via the p-MOS transistors 111, 113 during a precharging phase (i.e. CLK at a logical value "0"). When data signals D and /D are present, either the channel region of the first n-MOS logic field effect transistor 106 or that of the second n-MOS logic field effect transistor 107 conduct so that either /S or /R is pulled down to the electrical potential $V_{SS}$ 115 directly after the rising clock edge of CLK (i.e. out of the transition of CLK from a logic value "0" to a logic value "1").

This functionality is based on the disclosure of U.S. Pat. No. 4,910,713 with respect to differential flip flops via a differential sense amplifier.

The n-MOS bypass field effect transistor 108 has minimum dimensions and, following the rising clock edge, generates electrical coupling from a source/drain terminal of the first n-MOS signal transfer field effect transistor 109 and from a source/drain terminal of the second n-MOS signal transfer field effect transistor 110 to the electrical ground potential $V_{SS}$ 115 and ensures static operation. In this manner, the state of the pulse generator part-circuit 101 is stable after the rising clock edge.

The set/reset output stage from FIG. 1 is disclosed in U.S. Pat. No. 6,232,810.

Another circuit arrangement is described in U.S. Pat. No. 6,107,853.

Other flip flop circuits comprising a clock pulse field effect transistor and a logic field effect transistor are described in JP 200299623 A and U.S. Pat. No. 6,448,829 B1.

In summary, the circuit arrangements with pulse generator circuits, known from the prior art, are not sufficiently fast with respect to the switching speed for many applications.

SUMMARY OF THE INVENTION

The invention is based on the problem, in particular, of providing a pulse generator circuit and a circuit arrangement having a higher switching speed.

According to the invention, a pulse generator circuit for generating an input signal for a flip flop circuit from a clock signal and from a data signal is created which contains a clock pulse field effect transistor, at the gate terminal of which the clock signal can be applied and at the first source/drain terminal of which the input signal for a flip flop circuit can be provided. The data signal can be applied at the gate terminal of a logic field effect transistor and the first source/drain terminal of the logic field effect transistor is coupled to the second source/drain terminal of the clock pulse field effect transistor. Furthermore, a feedback field effect transistor is provided, at the gate terminal of which a feedback signal based on the clock signal can be applied, the first source/drain terminal of which is coupled to the second source/drain terminal of the logic field effect transistor and at the second source/drain terminal of which a first electrical reference potential can be applied. The pulse generator circuit also contains a control unit for controlling the clock pulse field effect transistor, the logic field effect transistor and the feedback field effect transistor in such a manner that, for generating the input signal, the clock pulse field effect transistor is chronologically activated after the logic field effect transistor and the feedback field effect transistor for generating the flip flop signal.

Furthermore, according to the invention, a circuit arrangement comprising a pulse generator circuit comprising the features described above and comprising a flip flop circuit is created which is interconnected with the pulse generator circuit in such a manner that the input signal which can be generated by the pulse generator circuit can be coupled into the flip flop circuit.

BRIEF DESCRIPTION OF THE DRAWINGS

Exemplary embodiments of the invention are shown in the figures and will be explained in greater detail in the text which follows. In the figures.

Identical or similar components are provided with the same reference numbers in different figures.

Figure 1:
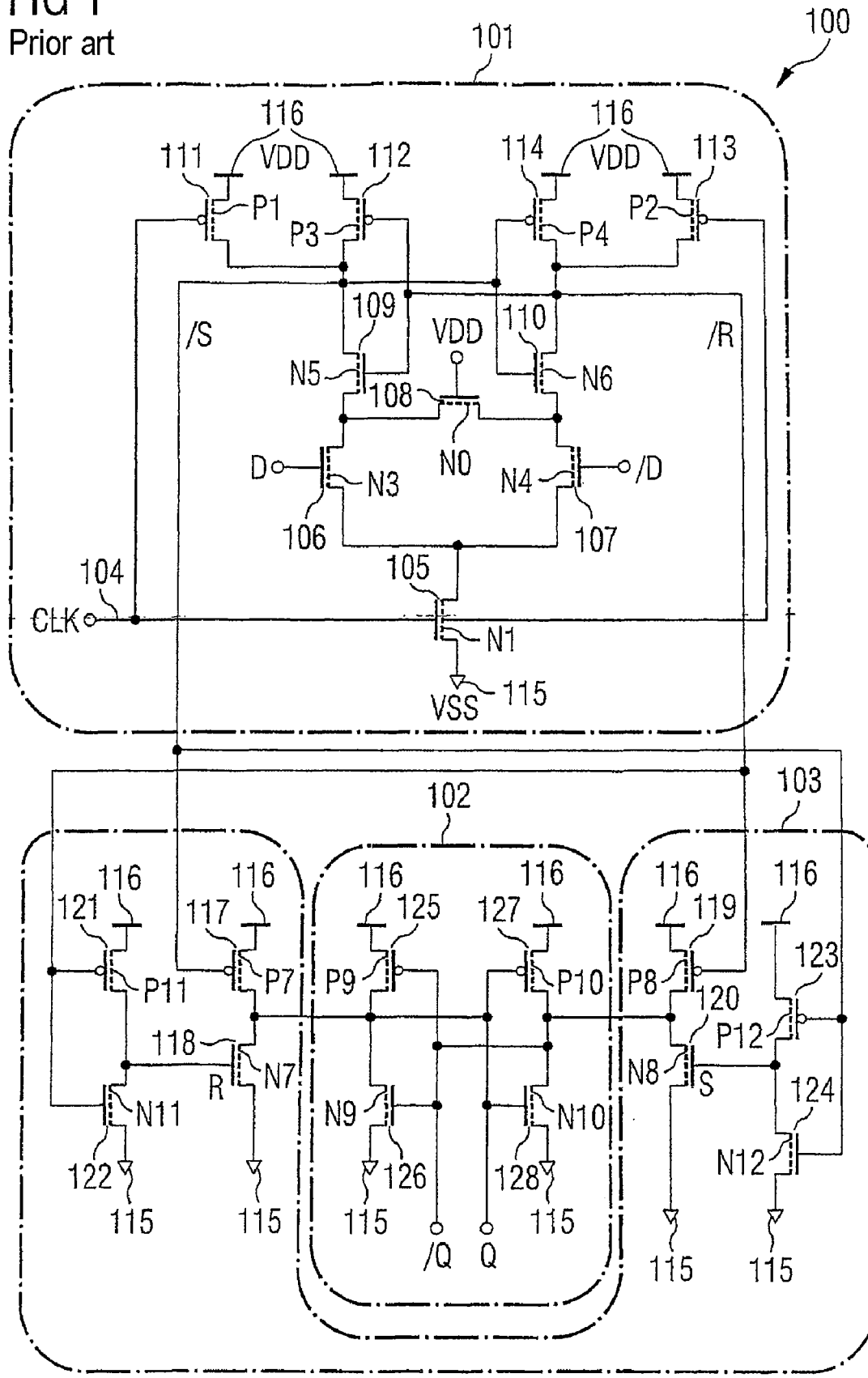
FIG. 1 shows a circuit arrangement according to the prior art.

The representations in the figures are diagrammatic and not to scale.

DETAILED DESCRIPTION OF THE INVENTION

A basic concept of the invention can be seen in the fact that, in a pulse generator circuit for generating an input signal for a flip flop circuit from a clock signal and from a data signal, a cascade of clock pulse field effect transistor, logic field effect transistor and feedback field effect transistor is interconnected in a manner modified compared with the prior art, in such a manner that an increased signal processing speed is achieved when a signal passes through the three transistors. This increase in speed is based on the fact that, for generating the input signal, the clock pulse field effect transistor arranged last or right at the end in the cascade with regard to the signal flow (i.e. the one at the terminal of which the input signal is generated) is chronologically activated only when the logic field effect transistor and the feedback field effect transistor have already been activated or switched for generating the flip flop signal.

In other words, according to the invention, the three above-mentioned transistors of the pulse generator circuit of an edge-controlled flip flop arrangement based on sense amplifiers are rearranged with respect to the prior art out in such a manner that the clock signal CLK arriving last controls the rearmost clock pulse field effect transistor in the cascade of the triple series arrangement of feedback field effect transistor, logic field effect transistor and clock pulse field effect transistor. At the clock pulse field effect transistor, the signal /S or /R, respectively, is generated at the drain as input signal for the flip flop circuit. According to the invention, an increase in clock pulse loading (which is based on the sum of all clock transistor pulse widths) is avoided since the transistor pulse widths of the transistors of the series arrangement can be reduced in comparison with the prior art. This results in a reduction in the delay time between the provision of the data signal D at the gate terminal of the logic field effect transistor and the generation of a flip flop signal Q (or between the provision of the data signal D/ and the generation of the flip flop signal Q/). It has been found that an acceleration of 20% to 27% compared with the prior art can be achieved in a voltage range of the supply potential $V_{DD}$ between 0.8 V and 1.2 V in a 90 nm CMOS technology.

A basic principle of the invention thus consists in the rearrangement of the transistors of the pulse generator circuit (clock pulse field effect transistor, logic field effect transistor and feedback field effect transistor) in the light of increased values of parasitic capacitances in sub-100-nm CMOS technologies. Another important aspect of the invention consists in the advantageous use of the dependence of the propagation time of signals in a transistor cascade on the arrangement of a transistor within such a series circuit.

In the further text, the principle used according to the invention is explained in greater detail. According to the invention, the fact is used that the delay time of a CMOS logic circuit as a series arrangement of transistors depends on which input signal changes its state when. Thus, for example, it can be observed that when a CMOS NAND gate is switched off (n-MOS transistors in series), the shortest delay time occurs when the n-MOS transistor of the series arrangement which is rearmost in the direction of signal flow (that is to say the transistor, the drain terminal of which is coupled to the output) is switched on last. This observation is probably attributable to the fact that the parasitic capacitances of the series arrangement have already been discharged via the series transistors switched on previously. Furthermore, the maximum possible drain-source voltage $V_{DS}=V_{DD}-V_{SS}$ is already present at the time when the rear transistor is switched on. The latter produces a maximum transistor current at the beginning of the switching process. The percentage differences between the slowest and the fastest switching process are up to 20% for example in the case of a NAND gate having four inputs.

According to the invention, these findings are used especially as a basis for accelerating the switching behavior of an edge-controlled flip flop based on sense amplifiers (sense amplifier-based flip flops). The starting point, according to the invention, for improving the circuit topology known from the prior art for such flip flops is the pull-down path consisting of at least three n-MOS transistors (transistors 105, 106 and 109 in FIG. 1). In the input stage of such a circuit arrangement comprising a flip flop, the dependence of the propagation time on the arrangement of the transistors switching last according to the prior art, described above, is not taken into consideration. In such flip flops, the clock signal CLK is the signal arriving last. According to the invention, the resultant signal delay is avoided by rearranging the clock pulse field effect transistor, the feedback field effect transistor and the logic field effect transistor, and controlling them in improved manner, according to the invention, as a result of which the propagation times of the flip flop are reduced.

In the pulse generator circuit according to the invention, an additional clock pulse field effect transistor can be provided, at the gate terminal of which the clock signal can be applied, at the first source/drain terminal of which a second electrical reference potential can be applied, and the second source/drain terminal of which is coupled to the first source/drain terminal of the clock pulse field effect transistor.

Furthermore, an additional feedback field effect transistor can be provided, the gate terminal of which is coupled to the gate terminal of the feedback field effect transistor, at the first source/drain terminal of which the second electrical reference potential can be applied, and the second source/drain terminal of which is coupled to the first source/drain terminal of the clock pulse field effect transistor.

In addition, the pulse generator circuit can have a bypass field effect transistor, the gate terminal of which is coupled to the flip flop circuit, at the first source/drain terminal of which the first electrical reference potential can be applied, and the second source/drain terminal of which is coupled to the second source/drain terminal of the clock pulse field effect transistor.

As an alternative, the pulse generator circuit can have a bypass field effect transistor, the gate terminal of which is coupled to the flip flop circuit, the first source/drain terminal of which is coupled to the first source/drain terminal of the feedback field effect transistor, and the second source/drain terminal of which is coupled to the second source/drain terminal of the clock pulse field effect transistor.

According to the embodiment described last, none of the source/drain terminals of the bypass transistor are connected to an electrical reference potential (for example an electrical ground potential) but are coupled to the source/drain terminals of the feedback field effect transistor or of the clock pulse field effect transistor, respectively. This improves the functionality of the pulse generator circuit since in the branch switched off, the so-called stack effect is active as a result of which the leakage current is reduced on this path.

The first electrical reference potential can be an electrical ground potential and/or the second electrical reference potential can be an electrical supply potential.

The clock pulse field effect transistor, the logic field effect transistor and the feedback field effect transistor can be field effect transistors of the n type of conduction.

The additional clock pulse field effect transistor and the additional feedback field effect transistor can be field effect transistors of the p-type of conduction.

The bypass field effect transistor can be a field effect transistor of the n-type of conduction.

Furthermore, a second signal path of additional field effect transistors which has the same circuit as the first signal path formed from the field effect transistors, is preferably provided in the pulse generator circuit, which additional field effect transistors are interconnected for generating from the clock signal and from a complementary data signal which is complementary to the data signal a complementary input signal which is complementary to the input signal of the flip flop circuit. According to this embodiment, the pulse generator circuit is constructed as a differential pulse generator circuit in which, to illustrate, a signal is provided which is in each case complementary to each signal.

In the second signal path, an identical or mirror-identical transistor is provided and interconnected for each transistor of the first signal path, to illustrate, particularly an additional clock pulse field effect transistor corresponding to the clock pulse field effect transistor, an additional logic field effect transistor corresponding to the logic field effect transistor and an additional feedback field effect transistor corresponding to the feedback field effect transistor etc.

The first source/drain terminal of the additional clock pulse field effect transistor of the second signal path can preferably be coupled to the gate terminal of the additional feedback field effect transistor of the first data path.

The first source/drain terminal of the clock pulse field effect transistor of the first signal path can be coupled to the gate terminal of the additional feedback field effect transistor of the second data path.

Furthermore, the control unit 250 can be set up in such a manner that it applies the data signal to the gate terminal of the logic field effect transistor before the clock signal is switched for changing the clock pulse field effect transistor from a state with electrically nonconducting channel region into a state with electrically conducting channel region. According to this embodiment, a particularly advantageous order of applying the signal to the transistors of the cascade of feedback field effect transistor/logic field effect transistor/clock pulse field effect transistor is created, and thus a particularly fast signal processing for generating an input signal for the switching part-circuit or the flip flop part-circuit, respectively.

In the further text, the circuit arrangement according to the invention which has a pulse generator circuit according to the invention is described in greater detail. Embodiments of the pulse generator circuit also apply to the circuit arrangement having a pulse generator circuit.

The flip flop circuit of the circuit arrangement can have storage field effect transistors for storing storage signals based on the input signal and/or the complementary input signal. Of these storage field effect transistors, two field effect transistors of different type of conduction in each case can be interconnected in each case to form an inverter, so that the flip flop circuit is essentially formed from two inverters.

The flip flop circuit can have field effect transistors which are connected between the storage field effect transistors and the pulse generator circuit.

In particular, a first switching field effect transistor can be provided, the gate terminal of which is coupled to the first source/drain terminal of the clock pulse field effect transistor, at the first source/drain terminal of which the second electrical reference potential can be applied, and the second source/drain terminal of which is coupled to a storage node of the storage field effect transistors.

In addition, a second switching field effect transistor can be provided, the gate terminal of which is coupled to the gate terminal of the complementary bypass field effect transistor, at the first source/drain terminal of which the first electrical reference potential can be applied, and the second source/drain terminal of which is coupled to the second source/drain terminal of the first switching field effect transistor.

In addition, a protective field effect transistor can be provided, the gate terminal of which is coupled to the gate terminal of the first switching field effect transistor, the first source/drain terminal of which is coupled to the second source/drain terminal of the first switching field effect transistor and to a source/drain terminal of a storage field effect transistor, and the second source/drain terminal of which is coupled to a source/drain terminal of another storage field effect transistor.

Figure 5:
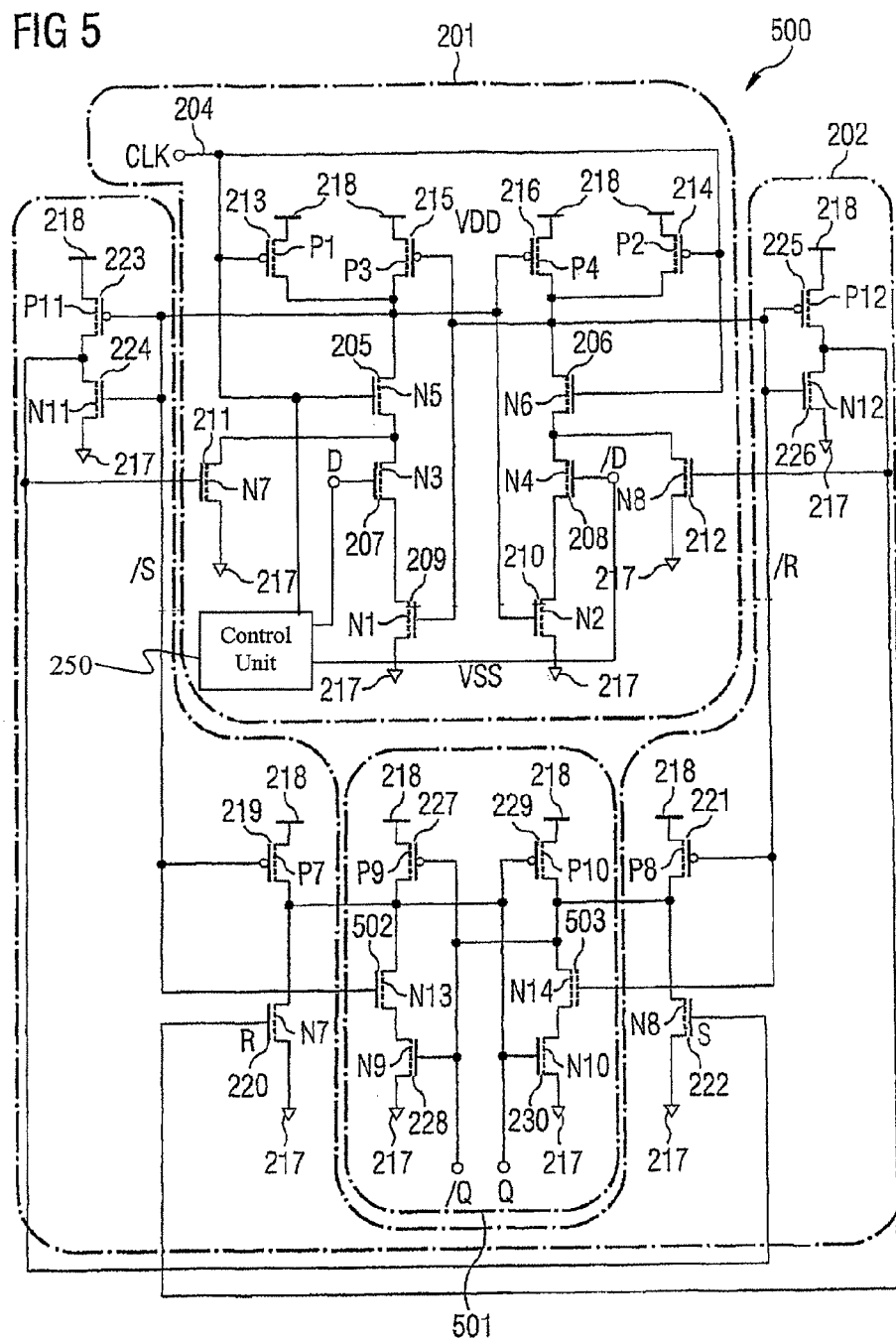
FIG. 5 shows a circuit arrangement according to a third exemplary embodiment of the invention.

According to this embodiment, which is implemented in the exemplary embodiment shown in FIG. 5, a shunt current between storage field effect transistors and switching field effect transistors is avoided, as a result of which the functionality of the circuit arrangement is improved with regard to speed and dynamic power dissipation.

Furthermore, the circuit arrangement can contain a fourth signal path of additional field effect transistors, which has the same circuit as the third signal path formed from the field effect transistors of the flip flop circuit, which additional field effect transistors of the flip flop circuit are interconnected for storing a complementary storage signal which is complementary to the storage signal.

In the further text, a circuit arrangement 200 according to a first exemplary embodiment of the invention is described with reference to FIG. 2.

The circuit arrangement 200 is formed from a pulse generator part-circuit 201, a flip flop part-circuit 202 and a switching part-circuit 203. The flip flop part-circuit 202 and the switching part-circuit 203 can also jointly be called flip flop circuit.

Firstly, the interconnection of the components in the pulse generator part-circuit 201 is described.

A clock signal CLK is provided at a clock signal input 204. The clock signal input 204 is coupled to the gate terminal of a first n-MOS clock pulse field effect transistor 205 and of a second n-MOS clock pulse field effect transistor 206. A first source/drain terminal of a first n-MOS feedback field effect transistor 209 is at the electrical ground potential 217. A second source/drain terminal of the first n-MOS feedback field effect transistor 209 is coupled to a first source/drain terminal of a first n-MOS logic field effect transistor 207, at the gate terminal of which a data signal D can be applied. A second source/drain terminal of the first n-MOS logic field effect transistor 207 is coupled to a first source/drain terminal of the first n-MOS clock pulse field effect transistor 205, the second source/drain terminal of which is coupled to a first source/drain terminal of a first p-MOS clock pulse field effect transistor 213 and to a first source/drain terminal of a first p-MOS feedback field effect transistor 215. The second source/drain terminal of the first p-MOS clock pulse field effect transistor 213 and of the second source/drain terminal of the first p-MOS feedback field effect transistor 215 are connected to the supply potential $V_{DD}$ 218. The gate terminal of the first p-MOS clock pulse field effect transistor 213 is coupled to the clock signal input 204. The gate terminal of the first p-MOS feedback field effect transistor 215 is coupled to the gate terminal of the first n-MOS feedback field effect transistor 209.

Furthermore, a first source/drain terminal of a second n-MOS feedback field effect transistor 210 is connected to the electrical ground potential 217. A second source/drain terminal of the second n-MOS feedback field effect transistor 201 is coupled to a first source/drain terminal of a second n-MOS logic field effect transistor 208, at the gate terminal of which a data signal /D can be applied which is complementary to the data signal D. A second source/drain terminal of the second n-MOS logic field effect transistor 208 is coupled to a first source/drain terminal of the second n-MOS clock pulse field effect transistor 206, the second source/drain terminal of which is coupled to a first source/drain terminal of a second p-MOS clock pulse field effect transistor 214 and to a first source/drain terminal of a second p-MOS feedback field effect transistor 216. A second source/drain terminal of the second p-MOS clock pulse field effect transistor 214 and a second source/drain terminal of the second p-MOS feedback field effect transistor 216 is in each case connected to the electrical supply potential 218. The gate terminal of the second p-MOS clock pulse field effect transistor 214 is coupled to the clock signal input 204. Furthermore, the gate terminal of the second p-MOS feedback field effect transistor 216 is coupled to the gate terminal of the second n-MOS feedback field effect transistor 210.

The second source/drain terminal of the first n-MOS logic field effect transistor 207 is coupled to a first source/drain terminal of a first n-MOS bypass field effect transistor 211, the second source/drain terminal of which is connected to the electrical ground potential 217. The first source/drain terminal of the second n-MOS clock pulse field effect transistor 206 is coupled to a first source/drain terminal of a second n-MOS bypass field effect transistor 212, the second source/drain terminal of which is connected to the electrical ground potential 217.

In the further text, the interconnection of the components of the switching part-circuit 203 is described.

A first source/drain terminal of a first p-MOS switching field effect transistor 219 is connected to the electrical supply potential 218. A second source/drain terminal of the first p-MOS switching field effect transistor 219 is coupled to a first source/drain terminal of a first n-MOS switching field effect transistor 220, the second source/drain terminal of which is connected to the electrical ground potential 217. Furthermore, the gate terminal of the first p-MOS switching field effect transistor 219 is coupled to the gate terminal of a third p-MOS switching field effect transistor 223, the first source/drain terminal of which is connected to the electrical supply potential 218. A second source/drain terminal of the third p-MOS switching field effect transistor 223 is coupled to a first source/drain terminal of a third n-MOS switching field effect transistor 224, the second source/drain terminal of which is connected to the electrical ground potential 217. Furthermore, the gate terminal of the third n-MOS switching field effect transistor 224 is coupled to the gate terminal of the first p-MOS switching field effect transistor 219.

A first source/drain terminal of a second p-MOS switching field effect transistor 221 is connected to the supply potential 218. A second source/drain terminal of the second p-MOS switching field effect transistor 221 is coupled to a first source/drain terminal of a second n-MOS switching field effect transistor 222, the second source/drain terminal of which is connected to the electrical ground potential 217. Furthermore, the gate terminal of the second p-MOS switching field effect transistor 221 is coupled to the gate terminal of a fourth p-MOS switching field effect transistor 225 and to the gate terminal of a fourth n-MOS switching field effect transistor 227. The gate terminal of the second n-MOS switching field effect transistor 222 is coupled to the second source/drain terminal of the third p-MOS switching field effect transistor 223. A first source/drain terminal of the fourth p-MOS switching field effect transistor 225 is connected to the supply potential 218, whereas a second source/drain terminal of the fourth p-MOS switching field effect transistor 225 is coupled to a first source/drain terminal of the fourth n-MOS switching field effect transistor 226, the second source/drain terminal of which is connected to the electrical ground potential 217.

Furthermore, the second source/drain terminal of the fourth p-MOS switching field effect transistor 225 is coupled to the gate terminal of the first n-MOS switching field effect transistor 220.

In the further text, the interconnection of the components of the flip flop part-circuit 202 is described.

A first source/drain terminal of a first p-MOS flip flop field effect transistor 227 is connected to the supply potential 218. Furthermore, a second source/drain terminal of the first p-MOS flip flop field effect transistor 227 is coupled to a first source/drain terminal of a first n-MOS flip flop field effect transistor 228, the second source/drain terminal of which is connected to the electrical ground potential. A first source/drain terminal of a second p-MOS flip flop field effect transistor 229 is connected to the electrical supply potential 218, whereas a second source/drain terminal of the second p-MOS flip flop field effect transistor 229 is coupled to a first source/drain terminal of a second n-MOS flip flop field effect transistor 230, the second source/drain terminal of which is connected to the electrical ground potential 230. The gate terminal of the first p-MOS flip flop field effect transistor 227 and the gate terminal of the first n-MOS flip flop field effect transistor 228 are coupled to one another and form an inverse storage node /Q of the flip flop part-circuit 202. Furthermore, the gate terminal of the second p-MOS flip flop field effect transistor 229 and the gate terminal of the second n-MOS flip flop field effect transistor 230 are coupled to one another and form a storage node Q of the flip flop part-circuit 202. The gate terminal of the first p-MOS flip flop field effect transistor 227 is coupled to the first source/drain terminal of the second n-MOS flip flop field effect transistor 230. Furthermore, the gate terminal of the second p-MOS flip flop field effect transistor 229 is coupled to the second source/drain terminal of the first p-MOS flip flop field effect transistor 227.

In the further text, the interconnection of the part-circuits 201, 202, 203 with one another is described.

The gate terminal of the second p-MOS feedback field effect transistor 216 is coupled to the gate terminal of the third p-MOS switching field effect transistor 223. The gate terminal of the first p-MOS feedback field effect transistor 215 is coupled to the gate terminal of the fourth p-MOS switching field effect transistor 225.

The second source/drain terminal of the first p-MOS switching field effect transistor 219 is coupled to the gate terminal of the second p-MOS flip flop field effect transistor 229. Furthermore, the second source/drain terminal of the second p-MOS flip flop field effect transistor 229 is coupled to the second source/drain terminal of the second p-MOS switching field effect transistor 221.

In the text which follows, the functionality of the circuit arrangement 200 is described.

The circuit arrangement 200 differs from the circuit arrangement 100 according to the prior art primarily with regard to the modifications described in the further text. The clock pulse transistor 105 from FIG. 1, which forms a differential stage with the first and second n-MOS logic field effect transistors 106, 107 (also called data input transistors), has been replaced by two clock pulse field effect transistors 205, 206 in FIG. 2. At the drain contacts of the first and second n-MOS clock pulse field effect transistors 205, 206, the respective output signals /S and /R, respectively, of the pulse generator input stage 201 are present which form input signals of the flip flop circuit 202, 203. The source contacts of the clock pulse field effect transistors 205, 206 are coupled to the drain contacts of the first and second n-MOS logic field effect transistors 207, 208 (also called data input transistors).

In a precharging phase, the first and second n-MOS clock pulse field effect transistors 205, 206 are closed. The internal signals /S and /R are charged to the electrical supply potential $V_{DD}$ by means of the clock signal CLK="0", which is at a low level. The two n-MOS transistors 209, 210, which, together with the first and second p-MOS feedback field effect transistors 215, 216 can form an amplifying feedback are switched on. Since either the first n-MOS logic field effect transistor 207 or the second n-MOS logic field effect transistor 208 is conducting (depending on whether the data signal is D="1" or D="0"), this state is transferred to the rising clock pulse edge and, with a data signal having a logical value D="1" (or D="0", respectively), a "1"-to-"0" transition to /S (or to /R, respectively), is generated.

An important advantage of the arrangement according to the invention consists in that the parasitic capacitances of the pull-down path of transistors 207/209 (or of transistors 208/210, respectively) are already discharged and the "1"-to-"0" pulse to /S and /R is generated more quickly. The only loads present are the gate terminals of the inverters formed from the transistor pairs 223, 224 and 225, 226, respectively, and the gate terminals of the switching transistors 219, 221. This leads to accelerated signal processing.

In the circuit arrangement 100 according to the prior art, the charges are still present on the internal nodes, that is to say the parasitic capacitances of the pull-down paths, at the beginning of the evaluation. Furthermore, the drain potentials of the data input transistors 106, 107 of the circuit arrangement and of the clock pulse transistor 105 are at a potential $V_{DD}-V_T$ (where $V_T$ is the threshold voltage of the transistor and $V_{DD}$ is the supply voltage), so that only the low drain-source voltage $V_{T0}$ is present at the transistors 109, 110 and a potential of 0 volt at the transistors 106, 107. The clock pulse transistor 105 has the drain-source voltage $V_{DD}-V_T$. In consequence, the switching current through the respective pull-down path is also less.

In the further text, the different switching currents in the circuit arrangement 100 according to the prior art and in the circuit arrangement 200 according to the invention are described with reference to FIG. 3.

Figure 3:
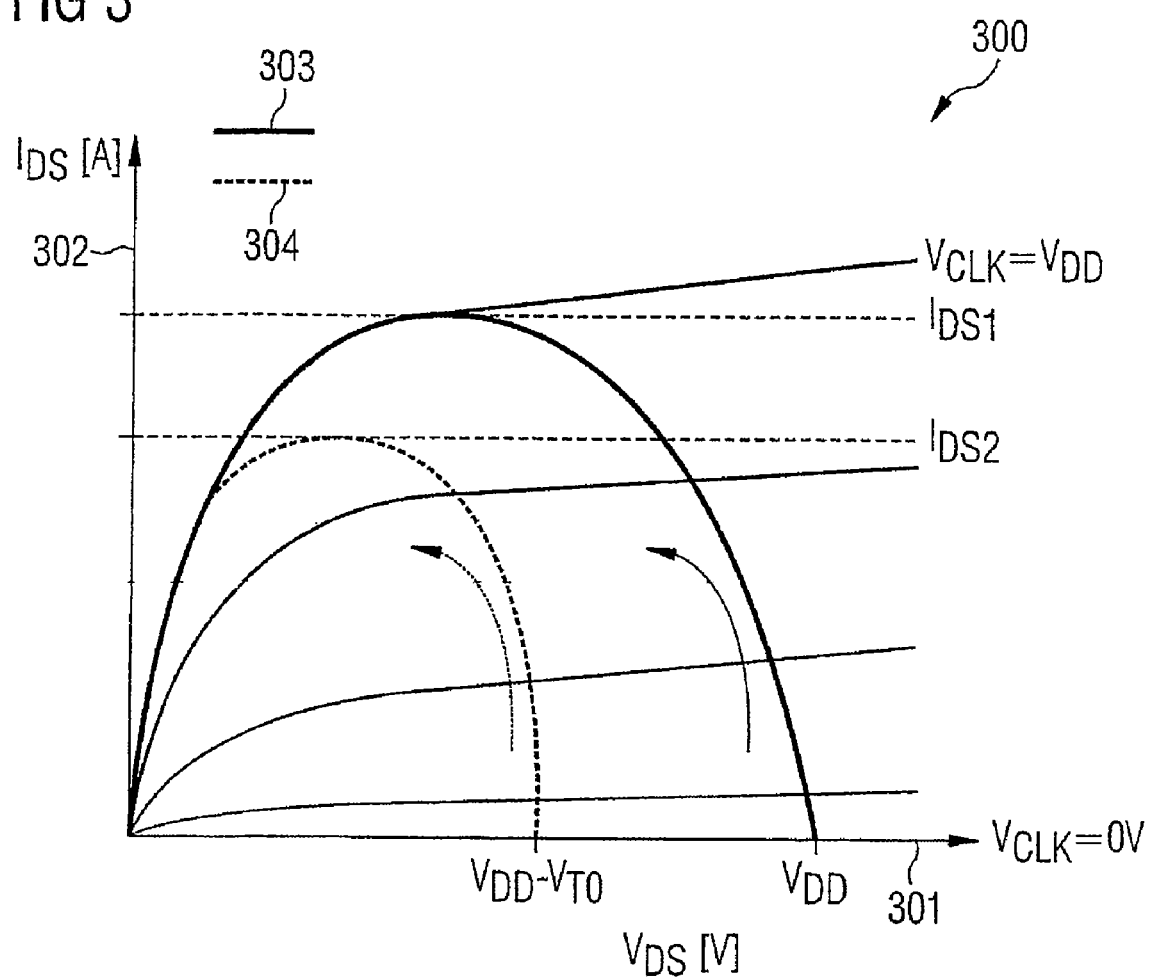
FIG. 3 shows a graph which illustrates the operation of the circuit arrangement from FIG. 2.

In the graph 300 from FIG. 3, the drain/source voltage $V_{DS}$ is plotted along an abscissa 301 and the drain/source current $I_{DS}$ is plotted along an ordinate 302. In the graph 300, a first curve 303 is shown which reflects characteristics of the circuit arrangement according to the invention. A second curve 304 shows the current-voltage characteristic for the circuit arrangement 100 from FIG. 1, known from the prior art.

Figure 2:
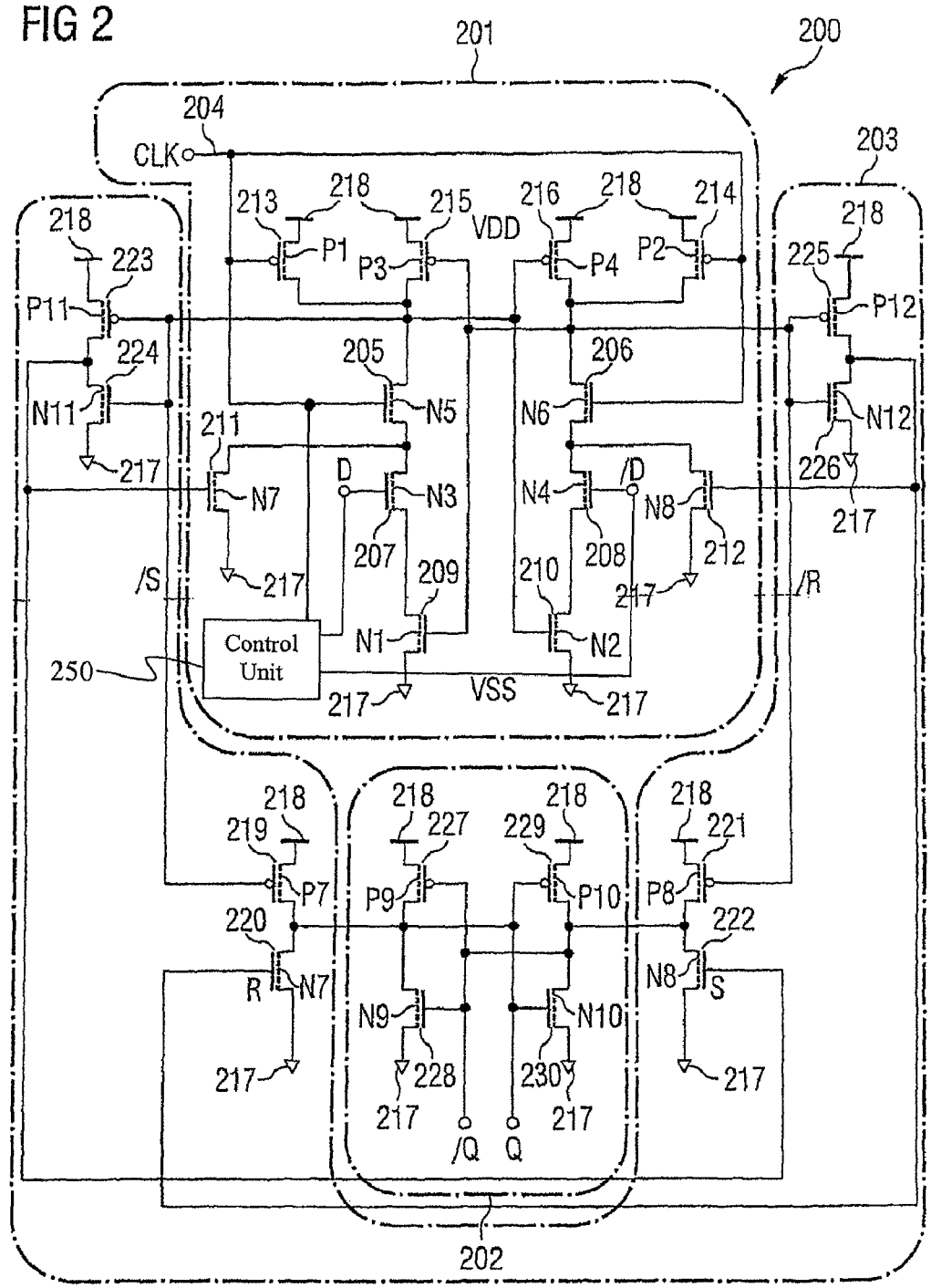
FIG. 2 shows a circuit arrangement according to a first exemplary embodiment of the invention.

FIG. 3 thus shows different operating states and trajectories in the family of output curves of the clock pulse transistors 205, 206 from FIG. 2 and of the clock pulse transistor 105 from FIG. 1 during the rising clock pulse edge of CLK with a low gate overdrive $V_{DD}-V_{T0}$. The higher switching current $I_{DS1}$ of the circuit arrangement 200 according to the invention due to the higher drain-source voltage in the initial state $V_{CLK}=0$ volt can be clearly seen from the first and second curves 303, 304.

In the circuit arrangement 200, the charges on the parasitic capacitances occurring in the circuit arrangement 100 and the disadvantageous operating states of the transistors according to FIG. 1 are avoided, as a result of which propagation times are achieved, which are shortened according to the invention.

Another difference of the circuit arrangement 200 compared with the circuit arrangement 100 consists in that the transistor 108 with minimum dimensions from FIG. 1 is eliminated in FIG. 2. Instead, the static operation of the circuit is ensured by two actively operated n-MOS transistors 211, 212 which form a bypass with respect to the input transistors 207, 208 and have minimum dimensions similar to the transistor 108 according to FIG. 1.

At the beginning of the evaluation phase, CLK is at a logical value "0" and /S=/R=$V_{DD}$. Since the gate terminals of the bypass transistors 211, 212 are driven with mutually inverse signals S and R, respectively, the bypass transistors 211, 212 are closed during the rising clock pulse edge and are only opened after a time $t_1=t_{CLK-S}+t_{INV}$ or $t_2=t_{CLK-/R}+t_{INV}$ respectively. If the data signal D is at a logical value "1", the bypass is opened after time $t_1$ by means of the bypass transistor 211 and the pulse-generator input stage 201 is latched. Possible potential fluctuations on the data nodes D and /D have virtually no effects on the signals in the flip flop circuit 102, namely Q and /Q, since a conducting connection of /S and /R, respectively, to the electrical current potential 217 is given via the bypass transistors 211, 212. The feedbacks from the two pull-down paths and the p-MOS transistors 215, 216 are thus activated for the duration of the clock pulse phase CLK="1", and static operation is given.

In the further text, a circuit arrangement 400 according to a second exemplary embodiment of the invention is described with reference to FIG. 4.

Figure 4:
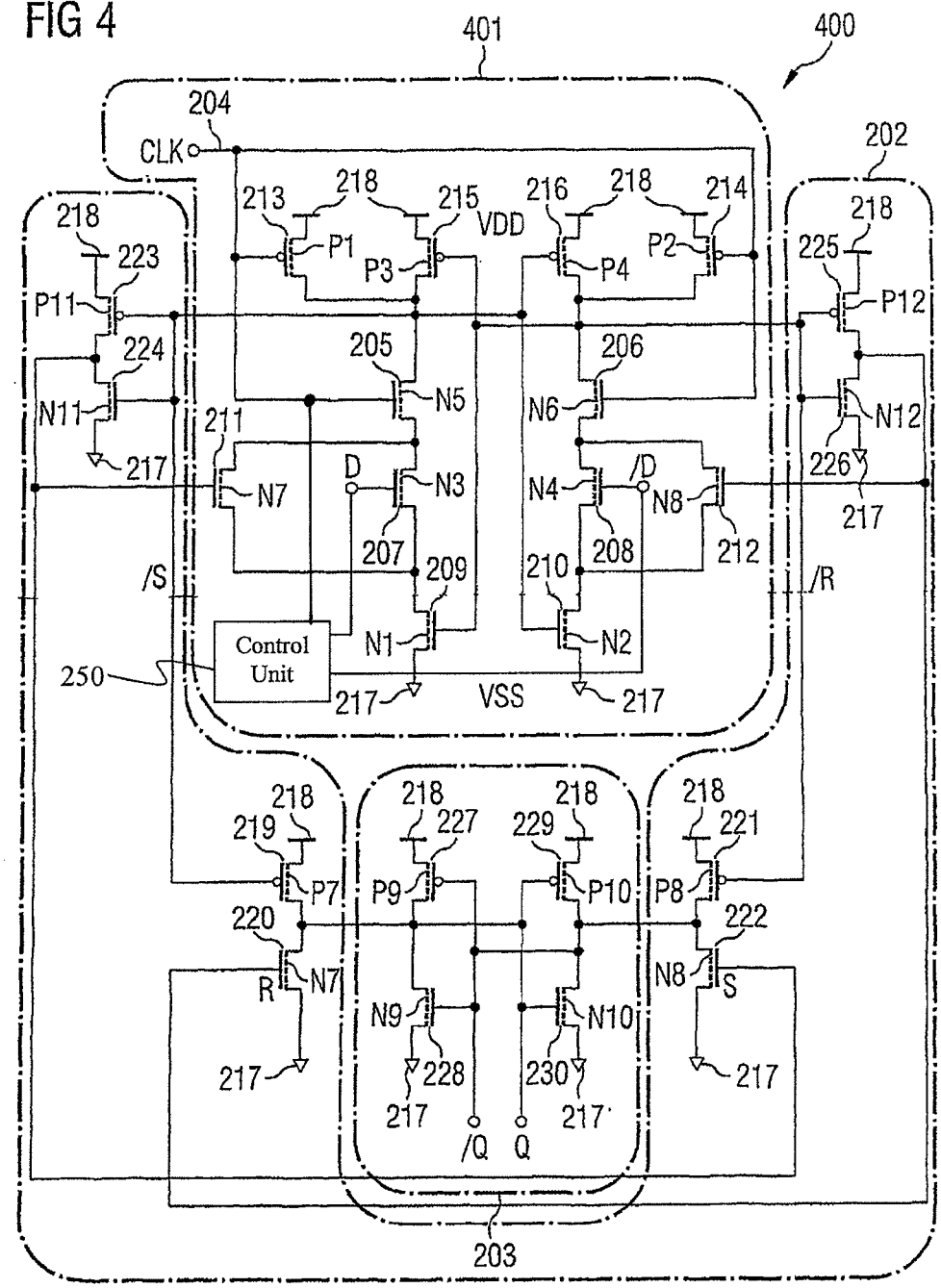
FIG. 4 shows a circuit arrangement according to a second exemplary embodiment of the invention.

The essential difference between the circuit arrangement 400 shown in FIG. 4 and the circuit arrangement 200 shown in FIG. 2 can be seen in the interconnection of the first and second n-MOS bypass field effect transistors 211, 212. In the circuit arrangement 400, as in the circuit arrangement 200, the gate terminal of the first n-MOS bypass field effect transistor 211 is coupled to the second source/drain terminal of the third p-MOS switching field effect transistor 223. Furthermore, in FIG. 4 as in FIG. 2, the first source/drain terminal of the first n-MOS bypass field effect transistor 211 is coupled to a second source/drain terminal of the first n-MOS logic field effect transistor 207. In deviation from FIG. 2, however, the second source/drain terminal of the first n-MOS bypass field effect transistor 211 is coupled to the second source/drain terminal of the first n-MOS feedback field effect transistor 209 in FIG. 4. In addition, the interconnection of the second n-MOS bypass field effect transistor 212 is modified in FIG. 4 compared with FIG. 2. Although the gate terminal of the second n-MOS bypass field effect transistor 212 is coupled to the second source/drain terminal of the fourth p-MOS switching field effect transistor 225 in FIG. 2, and the first source/drain terminal of the second n-MOS bypass field effect transistor 212 is coupled to the second source/drain terminal of the second n-MOS logic field effect transistor 208, the second source/drain terminal of the second n-MOS bypass field effect transistor 212 in FIG. 4 is coupled to the second source/drain terminal of the second n-MOS feedback field effect transistor 210 in deviation from FIG. 2.

Thus, in FIG. 4, both source/drain terminals of the bypass field effect transistors 211, 212 are free of being coupled to a reference potential. In other words, the source terminals of the bypass transistors 211, 212 are not connected to the electrical ground potential 217 but are coupled to the drain contacts of the transistors 209, 210. The functionality of the circuit arrangement 400 thus essentially corresponds to that of FIG. 2 but in the branch switched off, the stack effect is active as a result of which the leakage current is reduced on this path. The circuit arrangement 400 thus represents a particularly energy-saving implementation of the circuit arrangement according to the invention.

In the further text, a circuit arrangement 500 according to a third exemplary embodiment of the invention is described with reference to FIG. 5.

In the circuit arrangement 500 shown in FIG. 5, the pulse generator part-circuit 201 and the switching part-circuit 202 are provided as in FIG. 2. However, compared with FIG. 2, a modification has been carried out on the flip flop part-circuit 501 according to FIG. 5. In contrast to the circuit arrangement 200, the flip flop part-circuit 501 from FIG. 5 has a first n-MOS protection field effect transistor 502 and a second n-MOS protection field effect transistor 503. A first source/drain terminal of the first n-MOS protection field effect transistor 502 is coupled to the second source/drain terminal of the first p-MOS flip flop field effect transistor 227. The second source/drain terminal of the first n-MOS protection field effect transistor 502 is coupled to the first source/drain terminal of the first n-MOS flip flop field effect transistor 228. The gate terminal of the first n-MOS protection field effect transistor 502 is coupled to the gate terminal of the third n-MOS switching field effect transistor 224.

Furthermore, a first source/drain terminal of the second n-MOS protection field effect transistor 503 is coupled to the second source/drain terminal of the second p-MOS flip flop field effect transistor 229, a second source/drain terminal of the second n-MOS protection field effect transistor 503 is coupled to the first source/drain terminal of the second n-MOS flip flop field effect transistor 230. The gate terminal of the second n-MOS protection field effect transistor 503 is coupled to the gate terminal of the third p-MOS switching field effect transistor 225.

Due to the modification of the output stage or of the flip flop part-circuit 501, respectively, shown in FIG. 5, temporary shunt current paths via the transistor pairs 219/228 and 221/230, respectively, can be eliminated or at least reduced by adding the transistors 502, 503.

If the internal node is set to /R=$V_{SS}$ on the rising clock pulse edge during the evaluation, the transistor 221 can become conductive in the circuit arrangement 200. As long as the node R is not discharged, however, the transistor 230 is also conducting and a shunt current can flow. This current can no longer flow by adding the protective field effect transistor 503. The same applies to the transistor path 219/228/502. The transistors 502, 503 are dimensioned to be as small as possible. Due to the measure taken with the improved output stage compared with the circuit arrangements known from the prior art, the circuit arrangement 500 is improved with respect to speed and dynamic power dissipation. In particular, there are no longer any series circuits of p-MOS transistors in the output stage. This increases the robustness of the arrangement with respect to parameter fluctuations and the influence of interfering signals.

The invention claimed is:

1. A pulse generator circuit for generating an input signal for a flip flop circuit from a clock signal and from a data signal, comprising:

a clock pulse field effect transistor, at the gate terminal of which the clock signal is applied and at the first source/drain terminal of which the input signal for the flip flop circuit is provided;

a logic field effect transistor, at the gate terminal of which the data signal is applied and the first source/drain terminal of which is coupled to the second source/drain terminal of the clock pulse field effect transistor;

a feedback field effect transistor, at the gate terminal of which a feedback signal based on the clock signal is applied, the first source/drain terminal of which is coupled to the second source/drain terminal of the logic field effect transistor and at the second source/drain terminal of which a first electrical reference potential is applied, wherein the feedback field effect transistor is activated by a level of the clock signal that deactivates the clock pulse field effect transistor; and a control unit configured to apply the data signal to the gate terminal of the logic field effect transistor before the clock signal is switched to a level that activates the clock pulse field effect transistor such that, to generate the input signal, the clock pulse field effect transistor is chronologically activated after the logic field effect transistor and the feedback field effect transistor are activated.

2. The pulse generator circuit as claimed in claim 1, further comprising an additional clock pulse field effect transistor, at the gate terminal of which the clock signal is applied, at the first source/drain terminal of which a second electrical reference potential is applied, and the second source/drain terminal of which is coupled to the first source/drain terminal of the clock pulse field effect transistor.

3. The pulse generator circuit as claimed in claim 2, further comprising an additional feedback field effect transistor, the gate terminal of which is coupled to the gate terminal of the feedback field effect transistor, at the first source/drain terminal of which the second electrical reference potential is applied, and the second source/drain terminal of which is coupled to the first source/drain terminal of the clock pulse field effect transistor, wherein the additional feedback field effect transistor is activated by a level of the clock signal that deactivates the clock pulse field effect transistor.

4. The pulse generator circuit as claimed in claim 1, comprising a bypass field effect transistor, the gate terminal of which is coupled to the flip flop circuit, at the first source/drain terminal of which the first electrical reference potential is applied, and the second source/drain terminal of which is coupled to the second source/drain terminal of the clock pulse field effect transistor.

5. The pulse generator circuit as claimed in claim 2, wherein the first electrical reference potential is an electrical ground potential and/or wherein the second electrical reference potential is an electrical supply potential.

6. The pulse generator circuit as claimed in claim 1, wherein the clock pulse field effect transistor, the logic field effect transistor and the feedback field effect transistor are field effect transistors of the n-type of conduction.

7. The pulse generator circuit as claimed in claim 3, wherein the additional clock pulse field effect transistor and the additional feedback field effect transistor are field effect transistors of the p-type of conduction.

8. The pulse generator circuit as claimed in claim 4, wherein the bypass field effect transistor is a field effect transistor of the n-type of conduction.

9. The pulse generator circuit as claimed in claim 1, wherein the clock pulse field effect transistor, the logic field effect transistor, and the feedback field effect transistor form a first signal path, and
wherein the pulse generator circuit further comprises a second signal path having a complementary clock pulse field effect transistor, a complementary logic field effect transistor, and a complementary feedback field effect transistor which are interconnected in a same way as the clock pulse field effect transistor, the logic field effect transistor, and the feedback field effect transistor of the first signal path, and the complementary clock pulse field effect transistor, the complementary logic field effect transistor, and the complementary feedback field effect transistor are interconnected for generating from the clock signal and from a complementary data signal which is complementary to the data signal a complementary input signal which is complementary to the input signal for the flip flop circuit.

10. The pulse generator circuit as claimed in claim 9, wherein the first source/drain terminal of the additional clock pulse field effect transistor of the second signal path is coupled to the gate terminal of the additional feedback field effect transistor of the first data path.

11. The pulse generator circuit as claimed in claim 9, wherein the first source/drain terminal of the clock pulse field effect transistor of the first signal path is coupled to the gate terminal of the additional feedback field effect transistor of the second data path.

12. A circuit arrangement, comprising:
a pulse generator circuit as claimed in claim 1,
wherein the flip flop circuit, which is interconnected with the pulse generator circuit such that the input signal which is generated by the pulse generator circuit is coupled into the flip flop circuit.

13. The circuit arrangement as claimed in claim 12, wherein the flip flop circuit has storage field effect transistors configured to store a storage signal based on at least one of the input signal and the complementary input signal.

14. The circuit arrangement as claimed in claim 13, wherein the flip flop circuit comprises switching field effect transistors which are connected between the storage field effect transistors and the pulse generator circuit.

15. The circuit arrangement as claimed in claim 14, wherein the switching field effect transistors comprise a first switching field effect transistor, the gate terminal of which is coupled to the first source/drain terminal of the clock pulse field effect transistor, at the first source/drain terminal of which the second electrical reference potential is applied, and the second source/drain terminal of which is coupled to a storage node of the storage field effect transistors.

16. The circuit arrangement as claimed in claim 15, wherein the switching field effect transistors comprise a second switching field effect transistor, the gate terminal of which is coupled to a gate terminal of a complementary bypass field effect transistor, at the first source/drain terminal of which the first electrical reference potential is applied, and the second source/drain terminal of which is coupled to the second source/drain terminal of the first switching field effect transistor.

17. The circuit arrangement as claimed in claim 16, wherein the flip flop circuit comprises a protective field effect transistor, the gate terminal of which is coupled to the gate terminal of the first switching field effect transistor, the first source/drain terminal of which is coupled to the second source/drain terminal of the first switching field effect transistor and to a source/drain terminal of a storage field effect transistor, and the second source/drain terminal of which is coupled to a source/drain terminal of another storage field effect transistor.

18. The circuit arrangement as claimed in claim 13, wherein the flip flop circuit has complementary storage field effect transistors configured to store a complementary storage signal which is complementary to the storage signal.

19. A circuit arrangement, comprising:
a pulse generator means for generating an input signal for a flip flop circuit from a clock signal and from a data signal, comprising:
a clock pulse field effect transistor, at the gate terminal of which the clock signal is applied and at the first source/drain terminal of which the input signal for a flip flop circuit is provided;
a logic field effect transistor, at the gate terminal of which the data signal is applied and the first source/ drain terminal of which is coupled to the second source/drain terminal of the clock pulse field effect transistor;

a feedback field effect transistor, at the gate terminal of which a feedback signal based on the clock signal is applied, the first source/drain terminal of which is coupled to the second source/drain terminal of the logic field effect transistor and at the second source/drain terminal of which a first electrical reference potential is applied, wherein the feedback field effect transistor is activated by a level of the clock signal that deactivates the clock pulse field effect transistor; and a control means for applying the data signal to the gate terminal of the logic field effect transistor before the clock signal is switched to a level that activates the clock pulse field effect transistor such that, to generate the input signal, the clock pulse field effect transistor is chronologically activated after the logic field effect transistor and the feedback field effect transistor are activated, wherein the flip flop circuit is interconnected with the pulse generator means such that the input signal which is generated by the pulse generator circuit is coupled into the flip flop circuit.

20. A pulse generator circuit for generating an input signal for a flip flop circuit from a clock signal and from a data signal, comprising:

a clock pulse field effect transistor;

a logic field effect transistor;

a feedback field effect transistor; and a control unit configured to apply the data signal to the gate terminal of the logic field effect transistor before the clock signal is switched to a level that activates the clock pulse field effect transistor such that, to generate the input signal, the clock pulse field effect transistor is chronologically activated after the logic field effect transistor and the feedback field effect transistor are activated.

21. A pulse generator circuit for generating an input signal for a flip flop circuit from a clock signal and from a data signal, comprising:

a clock pulse field effect transistor;

a logic field effect transistor;

a feedback field effect transistor; and a control means for applying the data signal to the gate terminal of the logic field effect transistor before the clock signal is switched to a level that activates the clock pulse field effect transistor such that, to generate the input signal, the clock pulse field effect transistor is chronologically activated after the logic field effect transistor and the feedback field effect transistor are activated.

* * * * *